United States Patent
Mertens et al.

(10) Patent No.: US 6,821,349 B2
(45) Date of Patent: Nov. 23, 2004

(54) METHOD AND APPARATUS FOR REMOVING A LIQUID FROM A SURFACE

(75) Inventors: Paul Mertens, Haacht (BE); Marc Meuris, Keerbergen (BE); Marc Heyns, Linden (BE)

(73) Assignee: Interuniversitair Microelektronica Centrum (IMEC)

( * ) Notice: Subject to any disclaimer, the term of this patent is extended or adjusted under 35 U.S.C. 154(b) by 49 days.

(21) Appl. No.: 09/998,889

(22) Filed: Nov. 1, 2001

(65) Prior Publication Data

US 2002/0148483 A1 Oct. 17, 2002

Related U.S. Application Data

(63) Continuation of application No. 09/331,021, filed as application No. PCT/BE98/00140 on Sep. 24, 1998, now Pat. No. 6,334,902.
(60) Provisional application No. 60/059,929, filed on Sep. 24, 1997, provisional application No. 60/079,688, filed on Mar. 27, 1998, and provisional application No. 60/098,038, filed on Aug. 27, 1998.

(30) Foreign Application Priority Data

Mar. 20, 1998 (EP) .............................................. 98870056

(51) Int. Cl.$^7$ .............................. B08B 3/00; C23G 1/02
(52) U.S. Cl. ................... 134/2; 134/3; 134/30; 134/33; 134/102.1; 134/148; 134/902
(58) Field of Search .......................... 134/2, 3, 30, 32, 134/33, 37, 98.1, 99.1, 102.1, 102.3, 148, 902

(56) References Cited

U.S. PATENT DOCUMENTS

| | | | | |
|---|---|---|---|---|
| 4,027,686 A | * | 6/1977 | Shortes et al. ................. | 134/33 |
| 4,871,417 A | * | 10/1989 | Nishizawa et al. .......... | 438/748 |
| 5,058,610 A | | 10/1991 | Kuriyama ................. | 134/104.1 |
| 5,248,380 A | * | 9/1993 | Tanaka ......................... | 216/59 |
| 5,271,774 A | | 12/1993 | Leenaars et al. .............. | 134/31 |
| 5,873,380 A | * | 2/1999 | Kanno ..................... | 134/102.1 |
| 5,964,952 A | | 10/1999 | Kunze-Concewitz .......... | 134/2 |
| 5,972,127 A | | 10/1999 | Thompson et al. ........... | 134/33 |
| 5,980,647 A | | 11/1999 | Buker et al. .................. | 134/33 |
| 5,997,653 A | * | 12/1999 | Yamasaka ...................... | 134/2 |
| 6,059,893 A | | 5/2000 | Kawasaki .................... | 134/37 |
| 6,106,635 A | | 8/2000 | Hamada et al. ............... | 134/33 |

FOREIGN PATENT DOCUMENTS

| | | | | |
|---|---|---|---|---|
| JP | 59-184530 | 10/1984 | .................. | 134/33 |
| JP | 61-294825 | 12/1986 | .................. | 134/33 |
| JP | 62-232923 | 10/1987 | .................. | 134/33 |
| JP | 63-47929 | 2/1988 | .................. | 134/33 |

* cited by examiner

*Primary Examiner*—Randy Gulakowski
*Assistant Examiner*—Saeed Chaudhry
(74) *Attorney, Agent, or Firm*—McDonnell Boehnen Hulbert & Berghoff LLP

(57) ABSTRACT

A method and an apparatus for removing a liquid, i.e. a wet processing liquid, from at least one surface of at least one substrate is disclosed. A liquid is supplied on a surface of substrate. Simultaneously or thereafter the liquid or the substrate is locally heated to thereby reduce the surface tension of said liquid. By doing so, at least locally a sharply defined liquid-ambient boundary is created. According to the invention, the substrate is subjected to a rotary movement at a speed to guide said liquid-ambient boundary over the surface of the substrate thereby removing said liquid from said surface.

14 Claims, 5 Drawing Sheets

METHOD AND APPARATUS FOR REMOVING A LIQUID FROM A SURFACE

This is a continuation of application Ser. No. 09/331,021 now U.S. Pat. No. 6,334,902 which is 371 of PCT/BE98/00140, filed Sep. 24, 1998. This application also claims benefit to Provisional Application 60/098,038 filed Aug. 27, 1998 which claims benefit to Provisional Application 60/079,688 filed Mar. 27, 1998 which claims benefit to Provisional Application 60/059,929 filed Sep. 24, 1997.

FIELD OF THE INVENTION

The present invention is related to a method of removing a liquid from a rotating substrate. This liquid can be any wet processing liquid as e.g. a wet etching liquid or a cleaning liquid. It can also be a rinsing liquid. The invention is applicable for a number of wet processing steps which are frequently used in the fabrication process of integrated circuits or liquid crystal displays.

BACKGROUND OF THE INVENTION

The complete and efficient removal of a liquid from a surface of a substrate is a multiply repeated step in e.g. the fabrication process of integrated circuits. Such a step can be performed after a wet etching step or a wet cleaning step or a wet rinsing step or any other step used in said fabrication process wherein said substrate is treated or exposed or immersed in a liquid. Said substrate can be a semiconductor wafer or a part thereof or a glass slice or any other slice of an insulating or conductive material.

The manufacturing of integrated circuits evolves towards processing of each substrate individually rather than in batches of several substrates. In state of the art IC manufacturing, most processing steps as e.g. implantation steps, deposition steps are already performed in a single substrate mode. On the other hand, wet processing steps such as e.g. cleaning steps and subsequent liquid removal steps are typically performed in a batch mode because of lack of appropriate alternatives. Therefore, differences in waiting times are created for each individual substrate between a wet processing step, performed in a batch mode and another processing step, performed in a single substrate mode. Such variability is undesirable with regard to process control. Moreover this mixed batch and single substrate processing increases the cycle time, which is also undesirable. Therefore, there is a general interest in the development of competitive single substrate wet processing steps. Particularly, one of the major challenges regarding single wafer wet processing is a method for removing a liquid from both sides of a substrate. There are two major requirements to be fulfilled for such a method. At first the method should work sufficiently fast. Knowing that in state of the art production lines a substrate is processed typically every 2 to 3 minutes, ideally, in order to avoid equipment duplication, the process step and the liquid removal step should be completed in about such a time frame. Another requirement is related to the preferred substrate orientation. State of the art processing equipment and transportation tools are developed to handle substrates in a horizontal position. Therefore in order to avoid additional substrate handling it would be desirable to perform the wet processing steps using horizontally positioned substrates.

In the U.S. Pat. No. 5,556,479, a method is disclosed of drying substrates after treatment in a liquid. After such a treatment the wafers are immersed in rinse water. The wafer are dried by pulling said substrate being immersed in rinse water slowly out of said rinse water while heating the water interface. However, this known method requires that the substrates are pulled out of the rinse water in an upright position, i.e. a surface of said substrate is about perpendicular to the surface of the rinse water bath as can be seen in FIG. 3 of U.S. Pat. No. 5,556,479. This handling is incompatible with the majority of the other process steps where the equipment and transportation tools are developed to handle horizontally positioned substrates.

In the U.S. Pat. No. 5,271,774 a spin-drying technique is disclosed which is able to handle horizontal positioned substrates. In fact several small liquid islands are formed being removed from the substrate by a rotary movement. It is known that such a spin-drying technique leaves undesirable residues, often referred to as drying marks, on the substrate surface, particularly on surfaces having mixed hydrophilic and hydrophobic regions.

SUMMARY OF THE INVENTION

In an aspect of the invention a method is disclosed of removing a liquid from at least one surface of at least one substrate comprising the steps of:

subjecting said substrate to a rotary movement supplying a liquid on at least a part of said surface of said substrate; and locally heating said liquid on said part of said surface. while supplying said liquid, to thereby locally reduce the surface tension of said liquid. Particularly, by supplying said liquid and by locally heating said liquid on said part of said surface of said substrate, at least locally a sharply defined boundary is created between the liquid and the ambient, i.e. a so-called liquid-ambient boundary. Alternatively, the substrate can be heated locally at the liquid-ambient boundary. The heat is transferred to the liquid on the surface of the substrate near the liquid-ambient boundary to thereby reduce the surface tension of the liquid at this liquid-ambient boundary.

In an embodiment of the invention, said rotary movement is performed at a speed to guide said liquid-ambient boundary over said substrate. Particularly, this speed can be between 2 and 40 revolutions per second or between 1 and 50 revolutions per second or more than 40 revolutions per second. Preferably this boundary is a curved boundary. The configuration is such that the liquid is kept at the outerside of the curved boundary, i.e. at the liquid side of the liquid-ambient boundary. No liquid is present at the ambient side of the liquid-ambient boundary. In an embodiment of the invention the substrate can rotate around its own axis. Alternatively said substrate can also be subjected to a rotary movement where said substrate no longer rotates around its own centre but around and axis parallel to and offset to the axis perpendicular to and through the centre of the substrate.

In another embodiment of the invention, on said surface of said substrate fresh liquid is sprayed continuously. The entire surface at the liquid side of the liquid-ambient boundary can be covered, as e.g. for hydrophilic surfaces, with a continuous film of the liquid. The speed of the rotary movement is chosen such that the flow of said sprayed liquid on at least one side of the wafer is transported outwards due to the centrifugal forces. Moreover, by locally heating said liquid, the resulting surface tension reduction of said liquid facilitates the movement of said liquid towards an edge of the substrate. The surface left behind is cleaned and dried. It is presumed that this drying action is obtained according to at least the combination of the rotary movement and the Marangoni effect. According to the Marangoni effect, by locally heating the liquid a temperature gradient will be created in the liquid meniscus. This temperature gradient creates an additional force exerted on the liquid film in the direction of the liquid film resulting in a good drying performance.

The liquid is selected dependent upon the applied wet processing step like e.g. a wet etching step or a cleaning step or a rinsing step. To initiate the drying process, besides spraying liquid on at least a part of a surface of said substrate, the liquid is locally heated by a heat source to reduce the surface tension of the liquid. Particularly, the heat source can be a nozzle, movable or not, or a static inlet dispensing a heated gas or a heated vapor or a heated mixture of a vapor and a gas. Also other heat sources can be used such as laser beams or other energetic beams. provided that they can be sufficiently localized. A vapor is defined as the gas phase occurrence of an element or of a compound or of a mixture of elements if the element or compound or mixture should be in the liquid or solid phase at the given temperature and pressure conditions. Thus a vapor can co-exist in one environment with the solid or liquid phase of the element. A vapor is a specific gas phase occurrence of an element or a compound or a mixture of elements.

In another embodiment of the invention, another force can be combined with the liquid removal process of the present invention. Particularly, by using sonic energy as said other force to agitate the liquid applied during the removal process the cleaning performance of said liquid removal process can be enhanced. Doing so can help in particle reduction. Alternatively also contacting a surface with a rotating cleaning pad is an example of such other force.

In another embodiment of the invention, eventually prior to the liquid removal step an etching, a cleaning or a rinsing liquid or a sequence of such liquids can be supplied to the entire surface of a rotating substrate. The parameters can be optimized such that a liquid film can completely cover a surface. The spinning motion will quickly transport the liquid over the surface towards the edge, thus allowing relatively short carry-over transients and thus also allowing for relatively short rinsing times. Using such a continuously switched flow of liquids eliminates the undesirable passage of liquid-gas interfaces over the surface. The liquid removal method of the present invention is applicable for each sequence of at least one wet processing step by the liquid in order to reduce the surface tension of the liquid. The drying can thus be applied directly on the processing liquid if relevant for the application. Since the proposed drying technique is found to be very fast, process non-uniformity over the surface can be kept very low.

In an aspect of invention an apparatus is disclosed for removing a liquid from at least one surface of at least one substrate, said apparatus comprising:

- a substrate holder which is subjectable to a rotary movement, said substrate being releasably held by said substrate holder;
- at least one liquid supply system for applying a liquid on at least a part of said surface of said substrate;
- at least one heat source for locally heating said liquid. Preferably, said heat source and said liquid supply system are positioned such that the position where the heating takes place is closer to the centre of said rotary movement of said substrate holder than the position where said liquid is applied.

In an embodiment of the invention, said apparatus further comprises a chamber, wherein said substrate holder is positioned. This chamber is designed in a manner to avoid back splashing of the liquid removed from a surface onto said surface. For instance, a chamber having slanted walls may be used.

In another embodiment of the invention, said apparatus further comprises a generator of mechanical vibrations and a transmitter for transmitting said vibrational energy to a surface of the substrate via the liquid being supplied at said surface.

In another embodiment of the invention, the heat source is at least one nozzle which dispenses a heated gas or a heated vapor or a heated mixture of a vapor and a gas on said surface of said substrate and said liquid supply system can comprise at least one nozzle for applying said liquid on said surface of said substrate, said nozzles are positioned such that the position where the heating is performed is closer to the centre of the rotary movement of the substrate holder than the position where the liquid is applied. Particularly, at least locally a sharply defined liquid-ambient boundary can be created which is located in between a first and a second adjacent nozzle, said first nozzle being part of said heat source, said second nozzle being part of said liquid supply system Further according to the apparatus of the invention, said nozzles can be mounted on an arm, said nozzles being movable on said arm and/or said arm being movable relative to said substrate. The heat source can also be a laser beam or another energetic beam instead of a gas nozzle.

In case a heated gas or a heated vapor or a heated mixture of a vapor and a gas is dispensed to locally heat the liquid, the temperature of this heated gas or this heated vapor or this heated mixture is typically in the range from 20 to 200 degrees Celsius. However, the temperature of this heated gas or this heated vapor or this heated mixture is always higher than the temperature of the liquid.

DETAILED DESCRIPTION OF THE INVENTION

Figure 1:
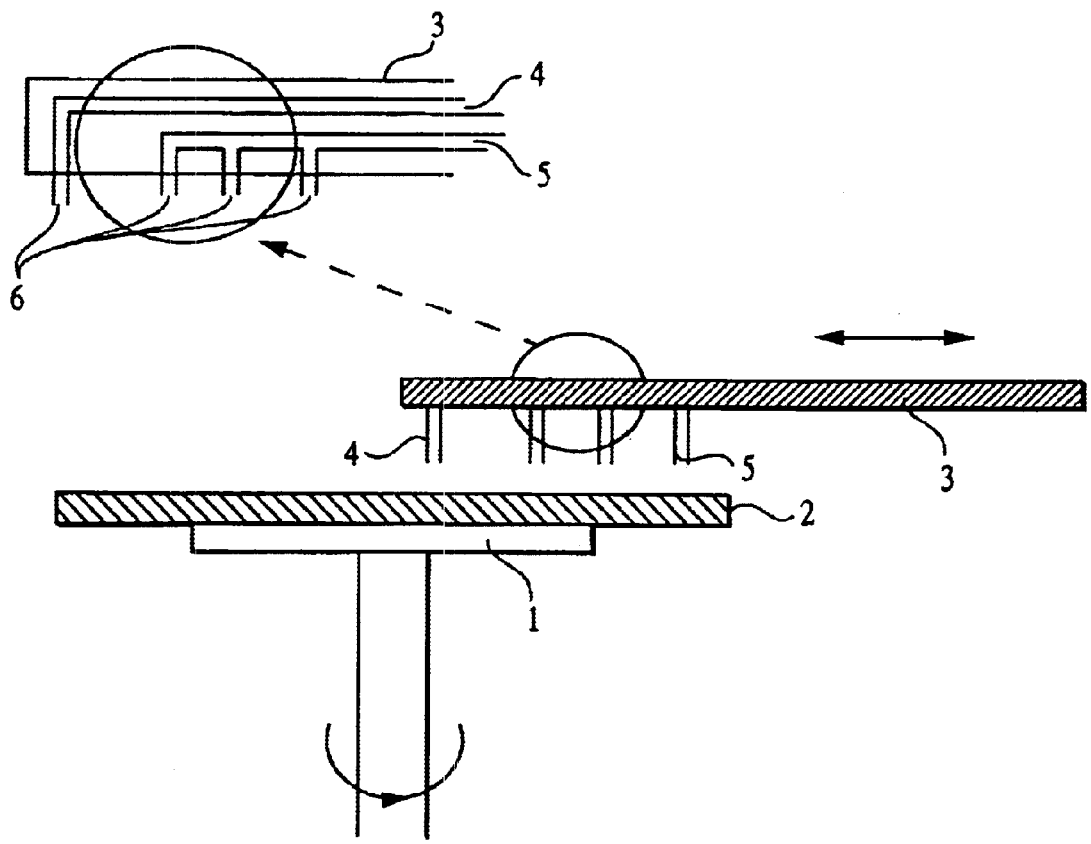
FIG. 1 depicts a schematic representation (vertical cross-section) of a tool used for removing a liquid from the topside of a surface of a rotating substrate according to an embodiment of the invention.

In relation to the appended drawings the present invention is described in detail in the sequel. Several embodiments are disclosed. It is apparent however that a person skilled in the art can imagine several other equivalent embodiments or other ways of executing the present invention, the spirit and scope of the present invention being limited only by the terms of the appended claims.

In an aspect of the invention a method of removing a liquid from at least one surface of at least one substrate is disclosed, said method comprising the steps of:
  subjecting said substrate to a rotary movement;
  supplying a liquid to said surface of said substrate;
  locally heating said substrate while supplying said liquid to thereby create at least locally a sharply defined liquid-ambient boundary by locally reducing the surface tension of said liquid. Particularly by locally heating the substrate and consequently the heat is transferred to the liquid near the liquid-ambient boundary, the surface tension of the liquid near this liquid-ambient boundary is reduced. Alternatively instead of heating the substrate, the liquid can also heated directly in-situ. Said boundary has to be such that, at least within the part of the surface which is not rewetted during a subsequent revolution, said boundary is a continuous one, i.e. said part is determined by the lateral movement of said boundary during a revolution. According to the method of the present invention, said rotary movement is performed at a speed to guide said liquid-ambient boundary over said substrate. The configuration is such that the liquid is kept at the liquid side of the liquid-ambient boundary. Said substrate can be a semiconductor wafer or a part thereof or a glass slice or any other slice of an insulating or conductive material.

According to this method of the invention, on at least one surface, preferably on both opposite surfaces simultaneously i.e. the top and bottomside, of at least one substrate fresh liquid is dispensed continuously. The entire surface at the liquid side of the liquid-ambient boundary can be covered with a film of the liquid. The speed of the rotary movement is chosen such that the flow of said liquid dispensed on said surface of the wafer is transported outwards due to the centrifugal forces. The rotational speed, the flow of the liquid supply, and the orientation and the velocity at which the liquid arrives on the surface can be optimized in order to result in a liquid film with a sharp and stable liquid-ambient boundary and to keep the thickness of the liquid film small enough to avoid excessive losses of liquid particularly on the bottomside by gravitational forces. Moreover, locally heating the liquid at the liquid-ambient boundary results in a surface tension reduction of said liquid thereby facilitating the movement of said liquid towards an edge of the substrate. The surface left behind is cleaned and dried. It is presumed that this drying action is obtained according to at least the combination of the Marangoni effect and a second force. Preferably this second force is the force introduced by a rotary movement or e.g. an oscillating movement. According to the Marangoni effect, by locally heating the liquid a temperature gradient will be created in the liquid meniscus. This temperature gradient creates an additional force exerted on the liquid film in the direction of the liquid film resulting in a good drying performance. Particularly, the centre of the rotary movement can coincide with the centre of the substrate, i.e. the substrate rotates around its own centre. In this case, if a liquid is dispensed on a surface of a substrate rotating typically with a speed between 2 and 20 revolutions per second, but the invention is not limited thereto, a curved shaped liquid-ambient boundary is created. The entire surface area outside of this curved boundary, can be covered with a film of the liquid. Particularly when using hydrophilic substrates, the entire surface area outside of this curved boundary is covered with a continuous film of the liquid. However also other more complex shaped boundaries can be created, particularly on substrates with a high contact angle for the liquid and if a low flow of liquid is applied. Such complex shaped boundaries will also assist in removing a liquid.

The liquid is selected dependent on the applied wet processing step: for etching steps, e.g. dilute aqueous solutions comprising e.g. HF can be used; for cleaning steps, e.g. a mixture of $NH_4OH$, $H_2O_2$ and $H_2O$ or a mixture of HCl, $H_2O_2$ and $H_2O$ or dilute HCl or a mixture comprising $O_3$ can be used; for rinsing steps, the rinsing liquid can comprise $H_2O$, or a mixture of $H_2O$ and an acid, said mixture preferably having a pH between 2 and 6. Preferably said acid is one of the group of $HNO_3$, $H_2CO_3$, $HCO_3$, HCl, HBr, $H_3PO_4$, $H_2SO_4$. To initiate the removal process, the liquid is dispensed on least a part of at least one surface of said substrate and said liquid is locally heated by a heat source. The removal process according to the present invention is only applicable if the liquid is compatible with the applied heating. Particularly, the heat source can be a nozzle, movable or not, or a static inlet dispensing a heated gas or a heated vapor or a heated mixture of a vapor and a gas. But also other heat sources can be used such as laser beams or other energetic beams, provided that they can be sufficiently localized.

There are several implementations of the present invention possible, but preferably the implementation has to be such that initially the heating is performed locally at or very close to the centre of the rotary movement, while the liquid is supplied slightly out of centre but adjacent to the position where the heating is performed. The liquid can also be supplied further away from said centre. By doing so on said surface of said substrate a liquid-ambient boundary can be formed which is initially located at said centre. Then, due to the rotary movement and the movement of the heating source and the liquid supply system, this boundary is slowly guided outwards from the centre to the edge to thereby remove the liquid or the solution of said liquid from said surface of said substrate. A sharply defined liquid-ambient boundary, at least locally, is helpful in order to obtain an optimal performance. The method of the present invention is perfectly suited to handle a horizontal positioned substrate resulting in a secure and reliable approach which is compatible with substrate handling in most of the other process steps in the manufacturing of integrated circuits. Moreover because, according to the present invention, the liquid of the liquid-ambient boundary is continuously refreshed, besides a good drying performance also a better cleaning performance is obtained simultaneously. A better cleaning performance can be obtained regardless of the precise nature of the liquid, i.e. a wet processing liquid like e.g. a cleaning liquid or a rinsing liquid or a wet etching liquid, as long as the liquid is compatible with the applied heating. Furthermore the required amounts of liquid are substantially lower compared with conventional wet processing baths or tanks.

According to the method of the present invention first the liquid can be supplied on a surface of a substrate at or very close to the centre of the rotary movement, while there is no gaseous substance supply. Then, the liquid supply is moved to supply the liquid slightly out of said centre and the liquid is locally heated at said centre while supplying liquid.

Further according to the method of the present invention the liquid can be supplied on a surface of a substrate at or very close to the centre of the rotary movement, while substantially simultaneously a the heat source is turned on to thereby locally heat the liquid adjacent to the centre of the rotary movement This heat source can be positioned adjacent to said liquid supply. Then, the liquid supply is moved slightly out of said centre, while the heat source is moved to supply heat to the liquid at said centre said centre. Once a liquid-ambient boundary is established, at least locally, both the liquid supply and the heat source are moved such that the liquid-ambient boundary is guided outwards. The ambient is a gas, preferably air and more preferably dry air.

In another embodiment of the invention the centre of the rotary movement coincides with the centre of the substrate, i.e. the substrate rotates around its own centre. Then the hearing source is moved to the centre of the rotary movement, i.e. the centre of the substrate, and the heating source is activated to locally heat the liquid at said centre while the liquid is supplied slightly out of centre. Additional liquid can also be supplied further away from said centre. By doing so on said surface of said substrate a liquid-ambient boundary is formed which is initially located at said centre. Then, due to the rotary movement and the movement of the heat source and the liquid supply system, this boundary is slowly guided outwards from the centre to the edge of said surface of said substrate to thereby remove the liquid or the solution of said liquid from said surface of said substrate.

In tests according to an embodiment of the invention, the method of the present invention is applied on the removal of liquid from hydrophilic silicon wafers with a diameter of 150 mm. The removal of the liquid from one surface, being the top side, of the wafer was evaluated. The wafer was mounted on a rotating vacuum chuck. The wafer was rotating around its centre at a speed of approximately 300 rpm. $N_2$ gas was heated using a simple heater equipped with a thermocouple-thermometer. Because of hardware limitations the maximum temperature of the gas that could be reached was approximately 50° C. In the tests this maximum temperature was chosen. The $N_2$ flow was set to approximately 3 slm. The liquid was ultra pure water and was supplied through a nozzle at a flow of approximately 70 ml/min. The hot N2 flow was applied through a second nozzle that was mounted on the same gear moving at a velocity of approximately 0.8 mm/s from the centre of the wafer to the edge. Using these non-optimized conditions the liquid could be removed from the wafer surface in 90 sec. It is believed that stronger heating results in a more powerful liquid-removal force, enabling a drastic reduction of the total process time.

In another embodiment of the invention, in order to enhance the cleaning performance of the liquid removal process of the present invention, an additional force can be exerted on the liquid, particularly on the liquid near the liquid-ambient boundary. Particularly, said liquid can be agitated by using megasonic energy. This megasonic energy can be generated locally by a generator and transmitted to the liquid. Particularly, said generator can be integrated in the liquid supply system and directly transmitting the megasonic energy to the liquid. Then, this megasonic energy is transferred to the surface of the substrate via the liquid. In an implementation a megasonic liquid nozzle or jet is used. This megasonic liquid nozzle consists of a liquid nozzle and a generator. The liquid which is dispensed on the surface by this megasonic liquid nozzle is agitated by means of said generator. Because there is a continuous flow between the megasonic liquid nozzle and the surface, the megasonic energy is transferred to the surface via the liquid to thereby enhance the cleaning performance of the liquid. This megasonic liquid nozzle can be mounted on an arm together with a heat source. In another implementation, a megasonic arm can be used. This megasonic arm consists of a megasonic generator and a liquid supply system. Particularly said megasonic generator comprises a transducer and a transmitter. Preferably this transmitter has a cylindrical shape and extends along said arm. Said megasonic arm extends over a surface of a substrate, preferably close to said surface. Liquid can be supplied to said surface of the substrate. This liquid is confined between said surface and said arm. So again the megasonic energy can be transmitted to the liquid by means of the transmitter and subsequently via said liquid to the surface of the substrate. Preferably, to maximize the capillary effect during the liquid removal process of the present invention, the distance between the arm and the surface of the substrate is about 0.5 mm or less, but the invention is not limited thereto.

In an aspect of the invention an apparatus for removing a liquid from at least one surface of at least one substrate is disclosed, said apparatus comprising:

a substrate holder (1) (11) which is subjectable to a rotary movement, said substrate (2) being releasably held by said substrate holder;

at least one liquid supply system (5) for applying a liquid on at least a part of said surface of said substrate;

at least one heat source (4) for locally heating said liquid. Preferably, said heat source and said liquid supply system are positioned such that the position where the liquid is heated is closer to the centre of said rotary movement of said substrate holder than the position where said liquid is applied.

Figure 6:
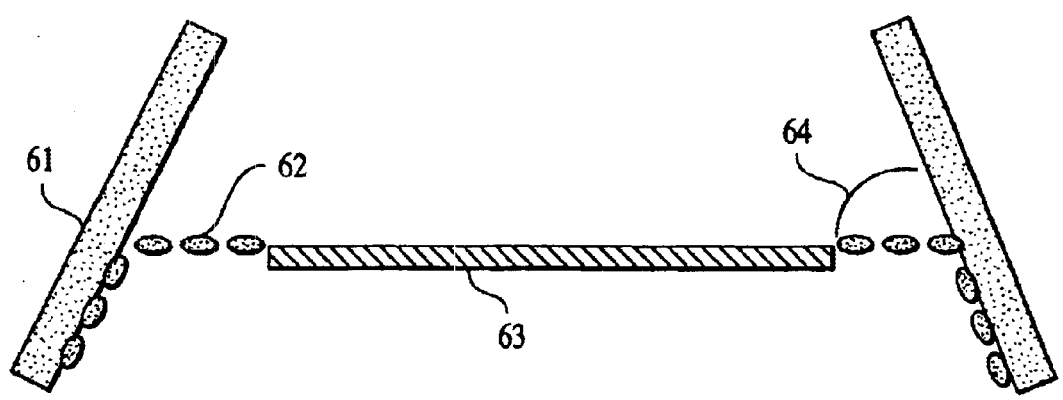
FIG. 6 depicts a cross section of a chamber, being part of an apparatus according to an embodiment of the invention, wherein a substrate can be releasably held in order to remove the liquid from its surface(s).

In an embodiment of the invention, said apparatus further comprises a chamber, wherein said substrate holder is positioned. This chamber is designed in a manner to avoid back splashing of the liquid removed from a surface onto said surface. For instance, a chamber having slanted walls may be used. Particularly as e.g. in FIG. 6, the substrate holder with the substrate releasably held thereon (63) may be positioned horizontally in said chamber. In such case, preferably the side walls (61) of said chamber, being the walls connecting the topside with the bottom side of said chamber, are oriented such that the angle (64) between said walls and the horizontally positioned substrate holder is smaller than 90 degrees in order to prevent back splashing of the liquid (62) which is removed according to the method of the present invention. The liquid leaving the substrate can be collected on theses wall and guided downwards to a drain.

In another embodiment of the invention, as illustrated in FIG. 1, a substrate (2) is placed on a revolving substrate holder (1). Said substrate can be placed in a chamber of a tool comprising at least one chamber. Preferably the ambient in the chamber is a dry ambient Said substrate holder and the substrate thereon are rotating with a speed which is typically between 2 and 20 or more revolutions per second. A movable arm (3), which can be guided between the centre and the edge of the substrate extends above the topside of the substrate. Initially one end of this arm is located near the centre of the rotary movement, i.e. the centre of the substrate. Said arm comprises a heat source (4) for locally heating the liquid and a liquid supply system comprising means (5) for supplying a liquid to the substrate. Said heat source further comprises at least one nozzle, initially being placed at or near the centre of the substrate, for dispensing a heated gas or a heated vapor or a heated mixture of a gas and a vapor on said substrate. Said second supply system further comprises at least one nozzle, being placed more outwards than said nozzle for dispensing said heated gas, for spraying said liquid on said substrate. Alternatively, instead of a movable arm comprising fixed nozzles also movable nozzles on a fixed arm can be used. To ensure that each part of the substrate is effectively dried, the translation speed, v, at which the arm, i.e. the nozzles, moves can be adapted to the rotational (angular) speed, Ω, of the substrate. Suppose that Δr is the translation distance, being the radial distance over which the liquid-ambient boundary extends radially during one revolution, then the rotational speed can be chosen such that:

$$\Delta r = \frac{2\pi v}{\omega}$$

For example, suppose that the translation distance per revolution, Δr, equals 1 mm and that the translation speed, v, equals 1 mm per second, then the rotational speed is 1 revolution per second.

Figure 3A:
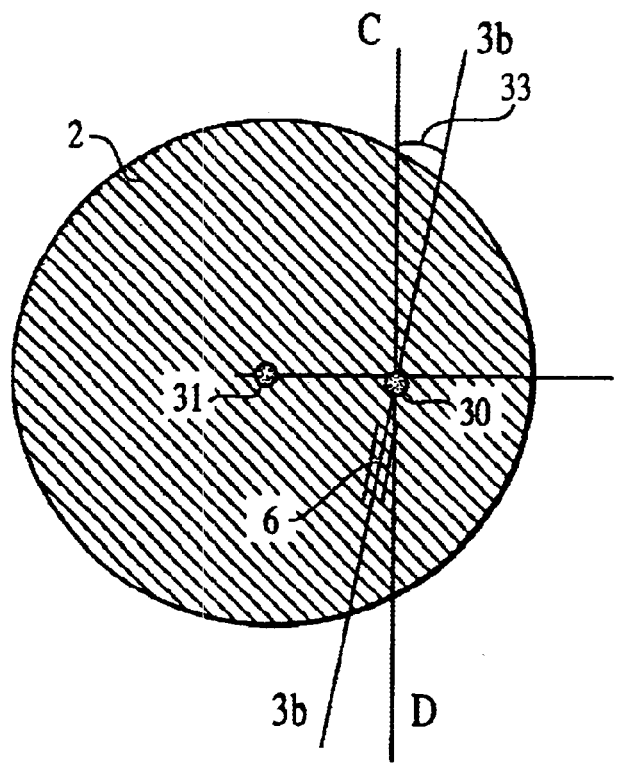
FIG. 3a) depicts a top view of the cross-sectional plane (C–D of FIG. 2b)) perpendicular to the surface of the substrate through the point of liquid impingement (30) and perpendicular to the imaginary line connecting the point of liquid impingement and the rotation centre (31) of a tool used for removing a liquid from a rotating substrate according to an embodiment of the invention. The vector representing the velocity of the liquid leaving the nozzle is in this cross-sectional plane (C–D) or in a plane (3b—3b) perpendicular to the surface of the substrate making a small angle (33) with (C–D), i.e. the liquid velocity vector can be slightly oriented outwards.
Figure 3B:
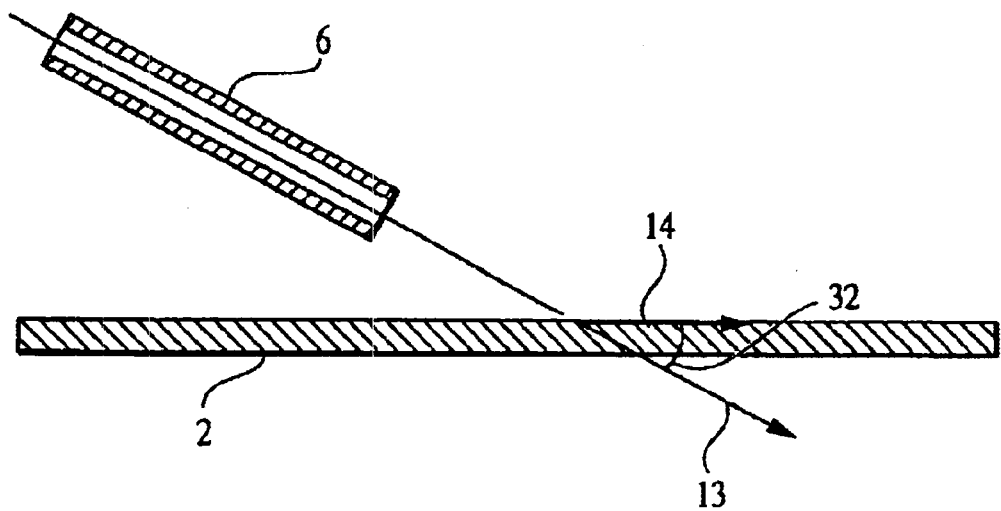
FIG. 3b) depicts the 3b—3b plane, which is the plane perpendicular to the surface of the substrate through the point of liquid impingement (30) making a small angle (33) with the plane (C–D). The vector representing the velocity of the liquid leaving the nozzle can be in this plane (3b—3b), i.e. the liquid velocity vector can be slightly oriented outwards.

In tests, the nozzles are located such that their centre lines will draw concentric circles on the surface with a difference in radius on the order of 5 mm. By doing so, at the topside of the substrate a curved liquid-ambient boundary is formed which is initially located at said centre of the substrate. Then this boundary is slowly guided outwards by moving said arm (3) from the centre to the edge of the substrate to thereby remove the liquid or the solution of said liquid from the topside of said substrate. The liquid-ambient boundary is located in between heat source and the nearest nozzle spraying the liquid. Spraying the liquid can be done such that at least locally a sharp and stable curved boundary is obtained, and particularly in case hydrophilic substrates are used the entire surface of the substrate at the outerside of the boundary is kept wet. This will involve optimization of the orientation of the liquid nozzle(s) and of the velocity of the liquid leaving the nozzle. In order to limit splashing of the liquid the angle (32) between the velocity vector of the liquid (FIG. 3 (13)) when leaving the nozzle and the velocity vector of the rotating surface (FIG. 3 (14)) at the point (30) where the liquid flow impinges can be kept small. Eventually, the liquid nozzles can also be slightly oriented outwards, i.e. typically at an angle (33) between 0 degrees and 5 degrees. For removing a liquid having a low contact angle in contact with the surface, it is found sufficient to have only one nozzle for supplying the liquid. In case of higher contact angles, in order to maintain a wet substrate surface outside the drying boundary, additional nozzles for spraying liquid can be installed at equal or greater distance from the rotation centre (31). In order to further limit the consumption of the liquid the additional nozzles can be turned off as they move over the substrate edge. It may be useful to progressively modulate the flow and the rotation speed as the drying proceeds from the centre towards the edge of the substrate.

Figure 2A:
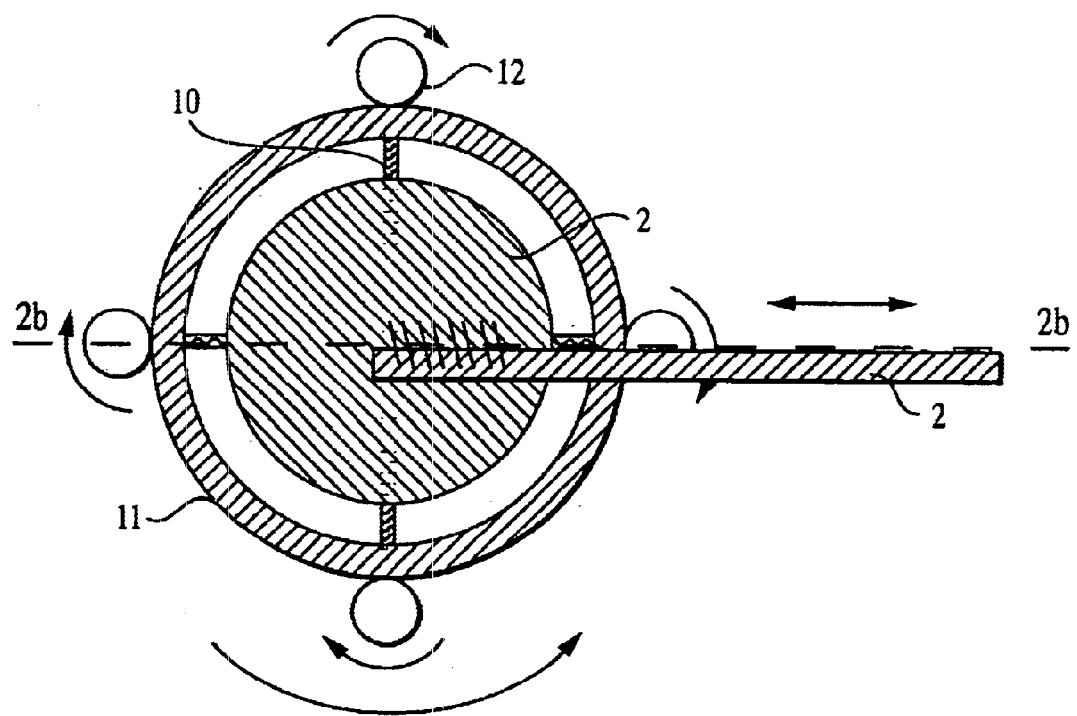
FIG. 2a) depicts a schematic representation, i.e. a top view, while FIG. 2b) depicts a cross-section (2b—2b) of a tool used for removing a liquid from a rotating substrate according to an embodiment of the invention.
Figure 2B:
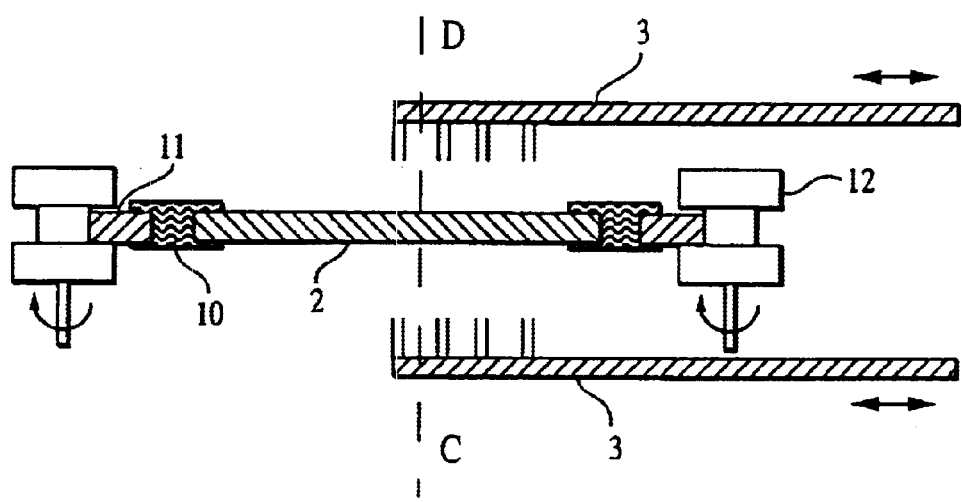

In another embodiment of the invention, as illustrated in FIG. 2, a substrate (2) can be clamped into a ring-shaped substrate holder (11) having an inner diameter larger than the diameter of the substrate. The damping is done using minimal contact surface. The substrate holder or alternatively the substrate itself is placed between at least two revolving means (12) which transmit the rotational force to said substrate holder comprising the substrate or alternatively to said substrate alone. Said substrate holder comprising said substrate or said substrate alone can be placed in a chamber of a tool comprising at least one chamber. Said substrate is rotating at a speed which is typically between 2 and 40 revolutions per second. Two movable arms (3), which can be guided separately or simultaneously between the centre and the edge of the substrate extend above the topside and below the bottomside of the substrate. Initially one end of each of these arms is located near the centre of the substrate. Each of these arms comprises a liquid supply system and a heat source being isolated one from the other. Said heat source and said liquid supply system are positioned such that at each side the position where the liquid is heated by the heat source is closer to the centre of said rotary movement of said substrate holder than the position where said liquid is applied. By doing so both at the topside and on the bottomside of the substrate a liquid-ambient boundary can be formed which is located at said centre of the substrate.

Then this boundary is slowly guided outwards by moving, said arms (3) from. the centre to the edge of the substrate to thereby remove the liquid or the solution of said liquid from the surfaces of said substrate. In order to limit splashing of the liquid the angle between the velocity of the liquid (FIG. 3 (13)) when leaving the nozzle and the velocity of the rotating surface (FIG. 3 (14)) at the point where the liquid flow impinges can be kept small.

Figure 4A:
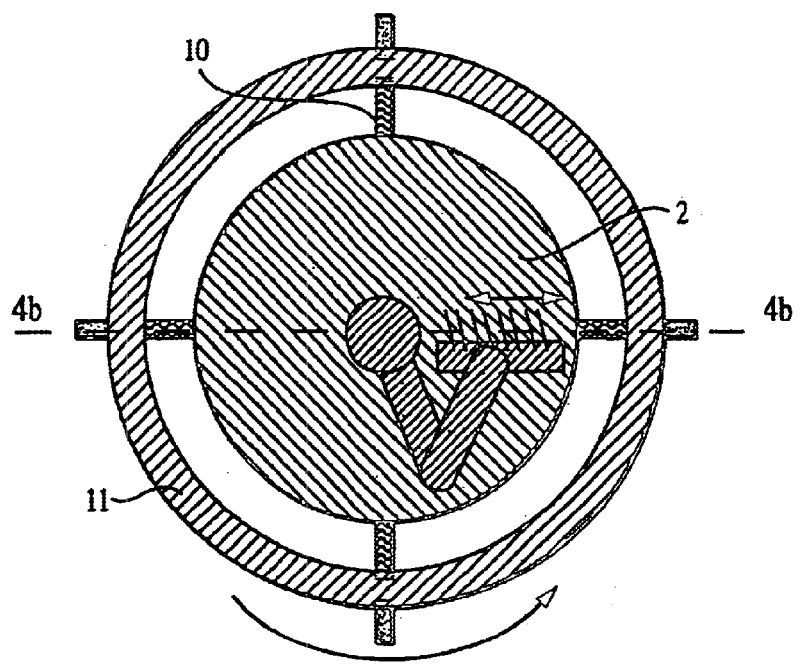
FIG. 4a) depicts a schematic representation, i.e. a top view, while FIG. 4b) depicts a cross-section (4b—4b) of a tool used for removing a liquid from a rotating substrate according to an embodiment of the invention.
Figure 4B:
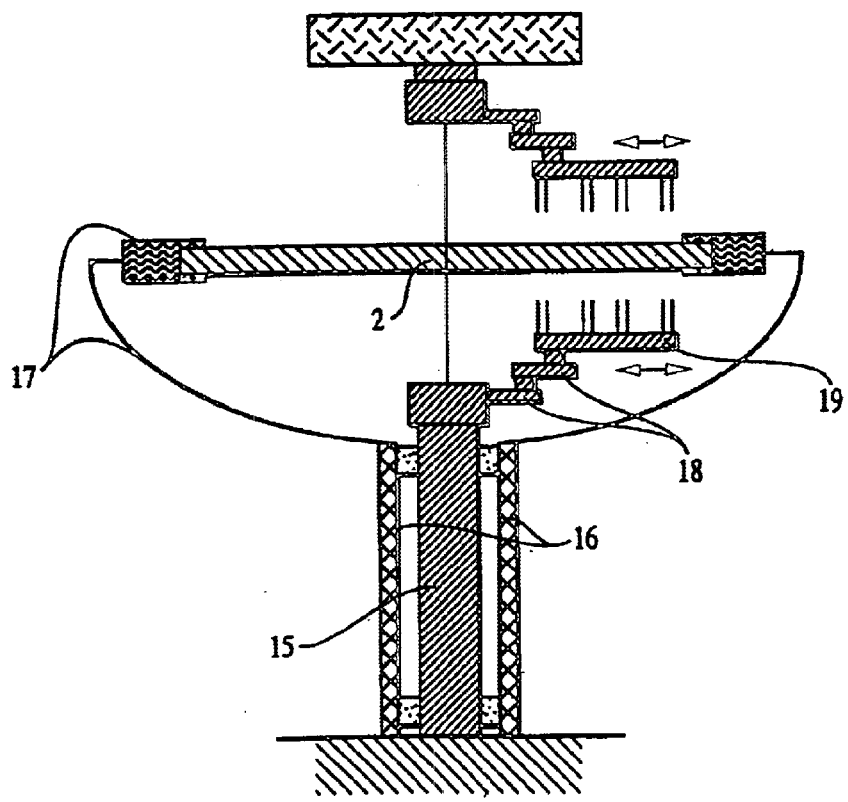

Another approach for building this rotation system is shown in FIG. 4. In this case, at the bottomside, a set of arms (18) with a bar of nozzles (19) attached thereon at the bottomside is mounted on a central shaft (15). Around this shaft a hollow shaft (16) is rotating. On this hollow shaft the clamping means (17) of the substrate are fixed. The set of arms moving over a radius of the substrate comprises at least a first arm and a second arm and can be made compact, i.e. like a man's arm. Said first arm is connected to said shaft to rotate about a first axis-orthogonal to and through the rotation centre of the substrate holder. Said second arm is parallel to but offset from the first arm with the first arm and the second arm being rotatably connected at a joint to rotate about an axis parallel to the first axis. The set of arms on the topside can be similar, but no rotation gear is required at the topside.

Figure 5:
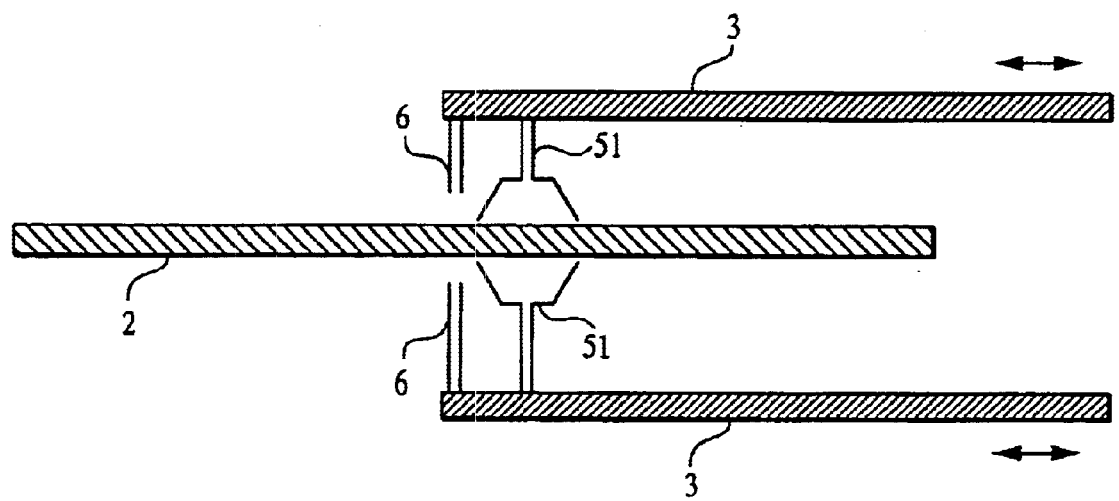
FIG. 5 depicts a vertical cross-section of an implementation of a tool according to an embodiment of the invention.

In another embodiment of the invention (FIG. 5), the liquid supply system (3) comprises a cup-shaped nozzle (51) which can be guided over the rotating substrate(2) and which is positioned very close to a surface of a substrate. Particularly, the distance between this cup-shaped nozzle and a surface of the substrate is typically about 0.5 mm. The liquid, e.g. water, can be supplied through the cup.

In another embodiment of the invention, said apparatus further comprises a generator of megasonic energy and a transmitter for transmitting said megasonic energy to a surface of the substrate via the liquid being supplied at said surface. In particular a megasonic liquid jet or a megasonic arm can be used

What is claimed is:

1. A method of removing a liquid from at least one surface of at least one substrate comprising the steps of:
   subjecting said substrate to a rotary movement;
   supplying a liquid on at least a part of said surface of said substrate; and
   locally heating said liquid on said part of said surface to remove at least a portion of said liquid and create a sharply defined liquid-ambient boundary, at least locally, while subjecting said substrate to said rotary movement and supplying said liquid, said liquid-ambient boundary separating a liquid-covered region and a liquid-removed region on said substrate, wherein said rotary movement is performed at a speed to guide the sharply defined liquid-ambient boundary over the substrate.

2. A method as recited in claim 1, wherein said rotary movement is applied to a single substrate such that said substrate rotates around its own center.

3. A method as in claim 2, wherein the rotation speed is in the range from 2 to 40 revolutions per second.

4. A method as recited in claim 1, wherein said heating is accomplished by one of dispensing a heated gas; dispensing a heated vapor; and dispensing a heated mixture of a gas and a vapor.

5. A method as recited in claim 1, wherein said liquid comprises one of an etching liquid, a cleaning liquid and a rinsing liquid.

6. A method as recited in claim 1, wherein said liquid comprises a dilute aqueous solution.

7. A method as recited in claim 5, wherein said cleaning liquid comprises one of a mixture of $NH_4OH$, $H_2O_2$ and $H_2O$; a mixture of $HCl$, $H_2O_2$ and $H_2O$; diluted $HCl$; and a mixture comprising $O_3$.

8. A method as recited in claim 5, wherein said rinsing liquid comprises one of $H_2O$; and a mixture of $H_2O$ and an acid, said mixture having a pH between 2 and 6.

9. The method of claim 1, wherein said liquid is supplied within said liquid-covered region of said liquid-ambient boundary.

10. A method of removing a liquid from a first surface and a second surface of at least one substrate comprising the steps of:

subjecting said substrate to a rotary movement;

supplying a liquid on at least a part of said first surface and at least a part of said second surface of said substrate; and locally heating said liquid on said part of said first surface and on said part of said second surface to remove at least a portion of said liquid, such that the surface tension of said liquid is locally reduced due to a surface tension gradient being formed in the liquid, the gradient being in a direction away from a sharply defined liquid-ambient boundary that is created, at least locally, during the steps of subjecting said substrate to a rotary movement, locally heating and supplying said liquid, said liquid-ambient boundary separating a liquid-covered region and a liquid-removed region on said substrate, and wherein said rotary movement is performed at a speed to guide the sharply defined liquid-ambient boundary over the substrate.

11. An apparatus for removing a liquid from at least one surface of at least one substrate, said apparatus comprising:

a substrate holder which is subjectable to a rotary movement, said substrate being releasably held by said substrate holder;

at least one liquid supply system for applying a liquid on at least a part of said surface of said substrate;

at least one heat source for locally heating and removing at least a portion of said liquid; and said heat source and said liquid supply system being positioned such that said heating is applied closer to the center of said rotary movement of said substrate holder than said liquid and wherein said heat source and said liquid are positioned such that, at least locally, a sharply defined liquid-ambient boundary is created on said surface of said substrate, said liquid-ambient boundary separating a liquid-covered region and a liquid-removed region on said substrate.

12. An apparatus as recited in claim 11, further comprising a chamber wherein said substrate holder is positioned, said chamber being designed in a manner to avoid back splashing of said liquid onto said surface of said substrate.

13. An apparatus as recited in claim 11, wherein said heating source comprises at least one nozzle for dispensing one of a heated gas; a heated vapor; and a heated mixture of a vapor and a gas onto said surface of said substrate, and said liquid supply system comprises at least one nozzle for applying said liquid on said part of said surface of said substrate, said nozzles are positioned such that said heating is applied closer to the center of the rotary movement of the substrate holder than said liquid.

14. An apparatus as recited in claim 13, where said nozzles are mounted on an arm, said arm being movable relative to said substrate holder.

\* \* \* \* \*